US007915884B2

(12) United States Patent  (10) Patent No.: US 7,915,884 B2
Birmiwal et al.  (45) Date of Patent: *Mar. 29, 2011

(54) IMPORTATION OF VIRTUAL SIGNALS INTO ELECTRONIC TEST EQUIPMENT TO FACILITATE TESTING OF AN ELECTRONIC COMPONENT

(75) Inventors: Parag Birmiwal, Austin, TX (US); Robert C. Dixon, Austin, TX (US); Hien M. Le, Cedar Park, TX (US); Kirk E. Morrow, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 482 days.

This patent is subject to a terminal disclaimer.

(21) Appl. No.: 12/128,058

(22) Filed: May 28, 2008

(65) Prior Publication Data
US 2009/0024346 A1  Jan. 22, 2009

Related U.S. Application Data

(63) Continuation of application No. 11/259,315, filed on Oct. 26, 2005, now Pat. No. 7,408,336.

(51) Int. Cl.
 G01R 23/16 (2006.01)
 G06F 17/50 (2006.01)
(52) U.S. Cl. .............. 324/76.22; 324/73.1; 324/158.1; 703/14
(58) Field of Classification Search ............... 324/76.22, 324/73.1, 158.1
See application file for complete search history.

(56) References Cited

U.S. PATENT DOCUMENTS

| 4,791,357 | A | 12/1988 | Hyduke |
| 5,066,909 | A | 11/1991 | Firooz |
| 5,629,858 | A | 5/1997 | Kundu et al. |
| 5,719,881 | A | 2/1998 | Yonetoku |
| 5,920,490 | A | 7/1999 | Peters |
| 6,055,661 | A | 4/2000 | Luk |
| 6,247,165 | B1 | 6/2001 | Wohl et al. |
| 6,370,675 | B1 | 4/2002 | Matsumura et al. |
| 6,378,090 | B1 | 4/2002 | Bhattacharya |
| 6,425,100 | B1 | 7/2002 | Bhattacharva |
| 6,609,231 | B2 | 8/2003 | Oda |
| 6,721,676 | B1 | 4/2004 | Ueda |
| 6,725,435 | B2 | 4/2004 | Cote et al. |
| 6,795,800 | B1 | 9/2004 | Lee |
| 6,901,356 | B1 | 5/2005 | Arita |
| 2005/0013356 | A1 | 1/2005 | Moacanin et al. |

*Primary Examiner* — Vincent Q Nguyen
(74) *Attorney, Agent, or Firm* — Heslin Rothenberg Farley & Mesiti, PC (57) ABSTRACT

Electronic component validation testing is facilitated by a method, system and program product which allows the importation of virtual signals derived from simulation verification testing of the electronic component design into electronic test equipment employed during validation testing of the actual electronic component. The method includes: storing simulation data resulting from simulation testing of an electronic component's design; employing electronic test equipment to perform real-time testing of the actual electronic component and obtain real-time test signals therefor; automatically correlating the stored simulation data with the actual real-time test signals; and performing at least one of overlaying and/or displaying the correlated simulation data as virtual signals with the real-time test signals; and employing a trigger event automatically ascertained from the stored simulation data and triggering the electronic test equipment based thereon, thereby automatically controlling real-time testing of the electronic component via the stored simulation data.

17 Claims, 6 Drawing Sheets fig. 1 fig. 2 fig. 3 fig. 5 fig. 6 fig. 7

IMPORTATION OF VIRTUAL SIGNALS INTO ELECTRONIC TEST EQUIPMENT TO FACILITATE TESTING OF AN ELECTRONIC COMPONENT

CROSS-REFERENCE TO RELATED APPLICATIONS

This application is a continuation of co-pending U.S. patent application Ser. No. 11/259,315, filed Oct. 26, 2005, entitled "Importation of Virtual Signals Into Electronic Test Equipment to Facilitate Testing of an Electronic Component", by Birmiwal et al., the entirety of which is hereby incorporated herein by reference.

TECHNICAL FIELD

This invention relates generally to electronic component performance evaluation, and more particularly, to importation of simulation data as virtual signals into electronic test equipment, and to the integration of the imported virtual signals and actual real-time test signals of the electronic component obtained via the electronic test equipment.

BACKGROUND OF THE INVENTION

The use of computer simulation is widespread in many areas such as circuit design. The cost of manufacturing an integrated circuit is extremely high, and it is often desirable that the hardware incorporated into the integrated circuit be verified prior to the actual fabrication of the chip. To that end, integrated circuit manufacturers often use simulators to verify the hardware and software intended to be executed by the hardware. The desired hardware design is designated at the "target hardware", while the desired software to be executed by the target hardware is designated as the "target program".

There are several techniques that are used to simulate target hardware and a target program for verification. One approach is to simulate the hardware using a computer hardware simulator. The hardware simulator is a software program that emulates the responses of the target hardware and is implemented entirely in software. Thus, in the hardware simulator, the target hardware and target program are simulated entirely by computer software. Various types of hardware simulators are known. Another approach uses a microprocessor emulator to model a microprocessor that is typically part of the target hardware and used to execute the target program. Thus, the target program and portions of the target hardware can be simulated by hardware devices such as a processor emulator.

In addition to hardware verification, an electronic component typically undergoes validation testing after actual construction of the hardware and testing of the actual software thereon. This component validation process typically employs electronic test equipment, such as an oscilloscope or a logic analyzer.

With the increasing complexity of electronic components, the visibility of internal states during the validation process is limited to dedicated input/output pins (or to scan-based designs). In the case of dedicated input/output pins, there is a limitation on the number of pins available, and a decision is necessarily made during design of an electronic component which signals will be made available either directly or via multiplex selection.

Often, it is desirable to know internal states of an electronic component during component validation testing in order to evaluate the correctness of generated component outputs, or to analyze unexpected behavior of the component outputs. Such output measurements are best made during validation testing of the actual electronic component, rather than during the component's design verification, which is a simulated environment.

SUMMARY OF THE INVENTION

Briefly summarized, the present invention comprises in one aspect a method of testing an electronic component. The method includes: storing simulation data resulting from simulation testing of an electronic component's design; employing electronic test equipment to perform real-time testing of the actual electronic component and obtain real-time test signals therefor; automatically correlating the stored simulation data with the actual real-time test signals; and performing at least one of: overlaying at least a portion of the correlated simulation data as virtual signals with corresponding real-time test signals for facilitating evaluation of the real-time test signals and the electronic component; displaying at least a portion of the correlated simulation data as virtual signals with the real-time test signals on a common display for facilitating evaluation of the real-time test signals and the electronic component; and employing a trigger event automatically ascertained from the stored simulation data, and triggering the electronic test equipment based thereon, thereby automatically controlling the actual real-time testing of the electronic component via the simulation data.

In another aspect, a system for testing an electronic component is provided. The system includes an electronic test equipment for performing real-time testing of an actual electronic component and obtaining real-time test signals therefor, and means for storing simulation data, obtained from simulation testing of the electronic component's design, in a format and location accessible electronically by the electronic test equipment. The system further includes means for automatically correlating the stored simulation data with the real-time test signals; and means for performing at least one of: overlaying at least a portion of the correlated simulation data as virtual signals with corresponding real-time test signals for facilitating evaluation of the real-time test signals and the electronic component; displaying at least a portion of the correlated simulation data and the real-time test signals on a common display; and employing a trigger event automatically ascertained from the stored simulation data, and triggering the electronic test equipment based thereon, thereby automatically controlling the real-time testing of the electronic component via the simulation data.

In a further aspect, at least one program storage device readable by a machine, tangibly embodying at least one program of instructions executable by the machine to perform a method of testing an electronic component is provided. The method includes: storing simulation data resulting from simulation testing of an electronic component's design; employing electronic test equipment to perform real-time testing of the actual electronic component and obtain real-time test signals therefor; automatically correlating the stored simulation data with the actual real-time test signals; and performing at least one of overlaying at least a portion of the correlated simulation data as virtual signals with corresponding real-time test signals for facilitating evaluation of the real-time test signals and the electronic component; displaying at least a portion of the correlated simulation data as virtual signals with the real-time test signals on a common display for facilitating evaluation of the real-time test signals and the electronic component; and employing a trigger event automatically ascertained from the stored simulation data, and triggering the electronic test equipment based thereon, thereby automatically controlling the actual real-time testing of the electronic component via the simulation data.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Generally stated, provided herein is a facility for capturing simulation results from a simulation environment and importing the results as simulation data into an electronic test equipment, such as an oscilloscope or logic analyzer. Once imported into the electronic test equipment, the simulation results can be synchronized to the real-time external test signals obtained from the electronic component under test. Once time synchronized, the simulation results can be employed in various ways. For example: (1) virtual signals derived from the simulation results can be employed to trigger the electronic test equipment, for example, based on a state of an internal state machine; (2) the simulation data can be displayed as virtual internal signals, as if the signals were being probed; and (3) the virtual signals could be employed as an overlay to actual corresponding external signals monitored by the electronic test equipment, for example, to automatically verify whether the electronic component is operating in accordance with the component's simulation data.

As noted, one example of a "virtual signal" is a set of signals associated with the state of an internal state machine of the electronic component. For a fully synchronous system, if the simulation data and the real-time accessible test signals for the component under test can be synchronized, then the state machine's current state can be displayed at any given time after the synchronization. For example, the virtual internal signal can be defined as state[0:n], where there are n+1 states defined for the state machine. Once imported to the test equipment, the virtual signal state[0:n] can be used to trigger the test equipment based on the state of the state machine, or can be used to display the internal state of the state machine where the test equipment is triggered by some external trigger or external state or can be used to overlay actual external signals or events with the same simulation signals employed during hardware verification to facilitate validation testing of the actual electronic component. Advantageously, the concepts presented herein can be readily implemented as a software solution within or in association with existing electronic test equipment hardware.

As used herein, "electronic component" means any electronic system, device, circuit, integrated circuit, VLSI, etc. undergoing verification and validation processing. The "electronic test equipment" can comprise any test equipment hardware, with an oscilloscope and logic analyzer being provided herein by way of example only.

Figure 1:
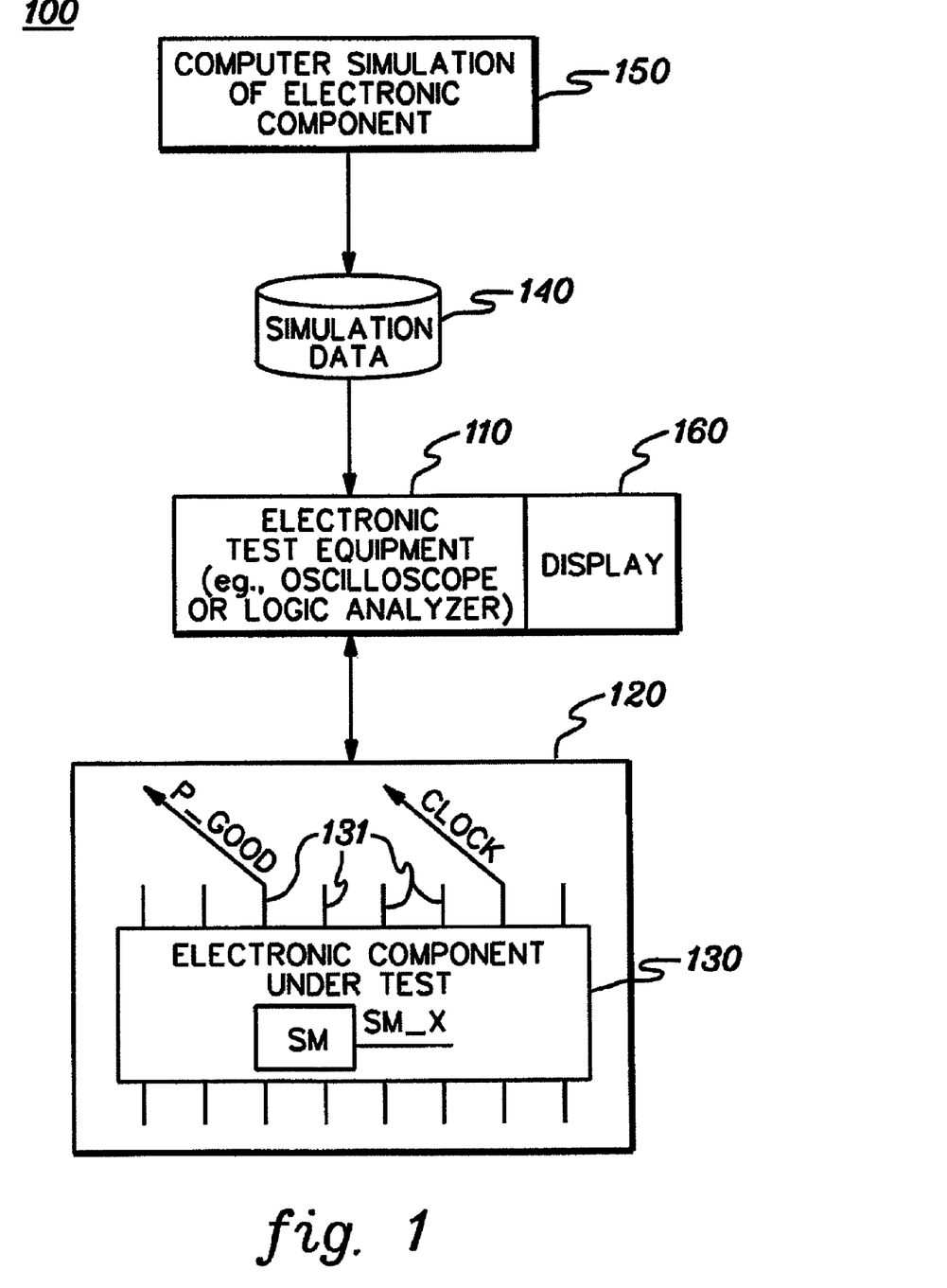
FIG. 1 depicts one embodiment of a system for testing an electronic component which allows importation of simulation data obtained from simulation testing of the component's design into a location and format accessible by an electronic test equipment for facilitating validation testing of the actual electronic component, in accordance with an aspect of the present invention.

FIG. 1 depicts one embodiment of a system, generally denoted 100, for testing an electronic component, in accordance with an aspect of the present invention. This system 100 includes an electronic test equipment 110 (and associated display 160) for validation testing of an actual electronic component under test 130, which is electrically coupled to a test fixture 120 associated with electronic test equipment 110. In addition to monitoring real-time external (i.e., accessible) test signals at the ports/pins 131 of component 130, electronic test equipment 110 further receives as input simulation data 140, which comprises verification results from a computer simulation of the electronic component's design 150.

Component modeling or simulation is well known in the art. For example, component design text or graphics may initially be generated to include system information, a processor core, custom logic or ASICs, and memory. This design information is then converted to a net list and the net list is converted to a cycle simulation model in a manner understood by one skilled in the art. The resulting simulation model is then employed within a cycle simulator as will be apparent to one skilled in the art.

An accurate cycle simulation model is discussed in detail in an article by Hallock et al. entitled "SIM API—A Common Programming Interface For Simulation," IBM J. Res. Develp. Vol. 41, No. 4/5 (July/September 1997), which is hereby incorporated herein by reference in its entirety. Further, various accurate cycle simulators are commercially available, for example, reference the SpeedSim™ cycle simulator marketed by Quick Turn Design Systems of San Jose, Calif., the Cobra™ cycle simulator marketed by Cadence Design Systems of San Jose, Calif. and the Cyclone™ UHDL cycle simulator marketed by Synopsys of Mountain View, Calif.

The simulation results are placed in storage as simulation data 140 in a format and location accessible by electronic test equipment 110. In one embodiment, the simulation data comprises data relevant to only selected signals, for example, of one or more state machines internal to the electronic component under test, or one or more simulation signals or events corresponding to external signals monitored by the test equipment. Importation of simulation data 140 can either be direct or subsequent to post processing of the simulation results. For example, the simulation data may be directly imported as a value change dump (VCD) file log, which includes changes to variable values such as values of signals in a file during a simulation session. VCD files are often used during verification of the electronic component design. VCD files can provide signal data on the component's internal logic. This data can then be graphically displayed or analyzed as described herein. Those skilled in the art will understand that a VCD file can be readily converted to a wave log format (WLF) file that can be viewed in a model SIM wave window.

Figure 2:
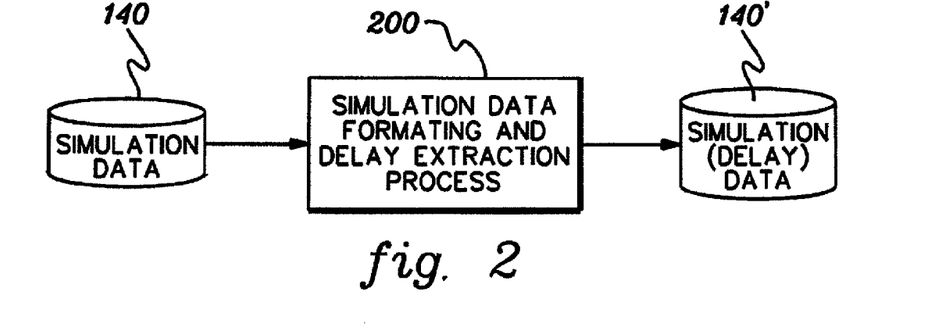
FIG. 2 is a representation of a data formatting and delay extraction process for converting simulation data into a compressed file format usable by the electronic test equipment, in accordance with an aspect of the present invention.

The simulation data can alternatively undergo reformatting and delay extraction processing 200, as depicted in FIG. 2. The reformatting and delay extraction processing can be performed prior to importation of the simulation data (as simulation (delay) data 140'), in order to improve efficiency of the electronic test equipment by providing compressed data representative of extracted virtual signals that may be of interest. The simulation results may be in many forms depending upon the type of simulation performed. It may be desirable to consolidate the simulation data into a format desirable for the particular electronic test equipment. Further, if validation testing of an electronic component is principally interested in a particular internal state machine of the electronic component with n states, then it may be desirable to simply extract the n internal signals for that state machine. This extraction process can be readily implemented in software by one skilled in the art. Further, the simulation data can be compressed into delay data by recording signal changes for the virtual signals of interest. This compression or delay extraction is an optional process and may not be required depending upon the particular configuration of the electronic test equipment and the form(s) of data supported by the equipment. Upon importation to the electronic test equipment, the simulation data 140 (or optionally, the simulation (delay) data 140'), is stored within the electronic test equipment for subsequent correlation to real-time test signals. Alternatively, simulation data 140 could be stored external to the electronic test equipment, but made accessible thereto via an appropriate network connection. For example, the simulation data might be maintained at a computer system coupled to the electronic test equipment.

Figure 3:
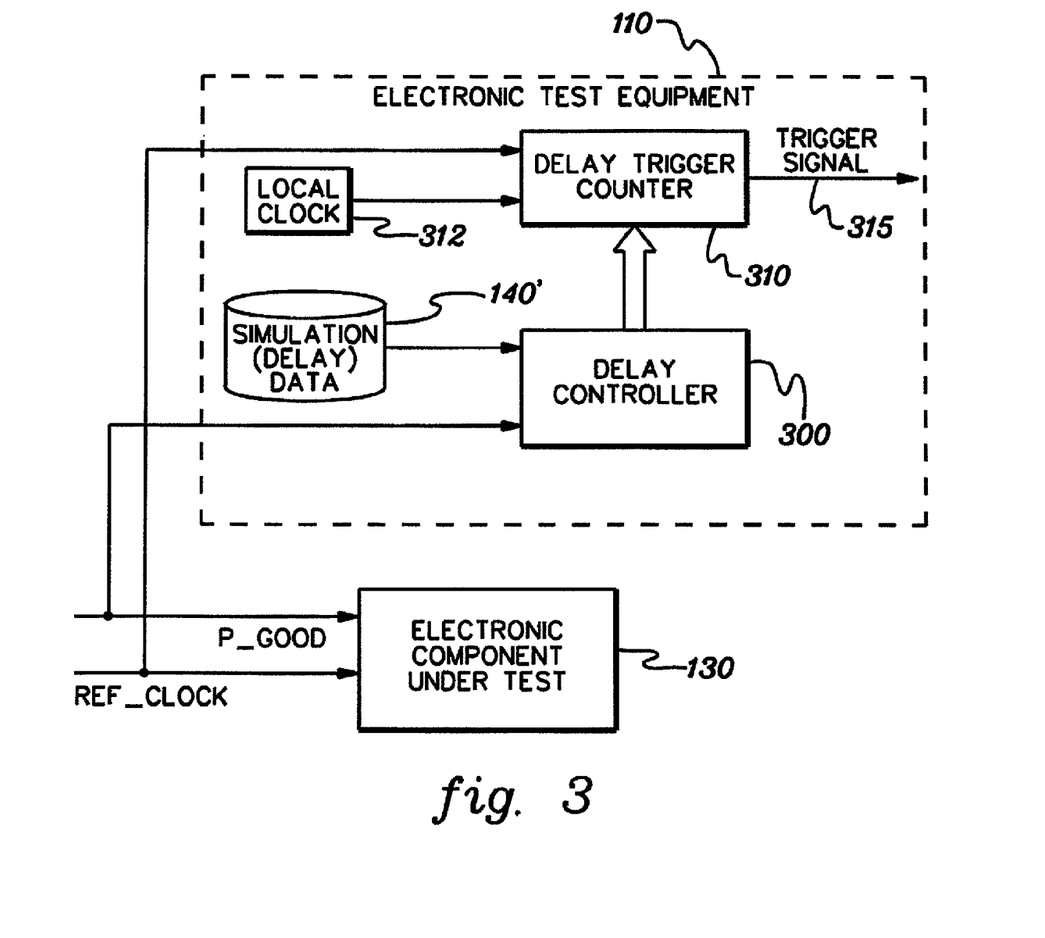
FIG. 3 is a depiction of one embodiment of an electronic test equipment and an electronic component under test, in accordance with an aspect of the present invention.

FIG. 3 depicts a more detailed embodiment of electronic test equipment 110 and electronic component under test 130. Again, simulation (delay) data 140' may either be stored internal to the electronic test equipment, as shown, or stored external and fetched by a network connection as required to reduce actual equipment memory requirements. In the example described herein, the asynchronous signal p_good (also referred to as "power_good") is employed as a synchronizing signal. This synchronizing signal is also in the simulation (delay) data 140'.

Figure 7:
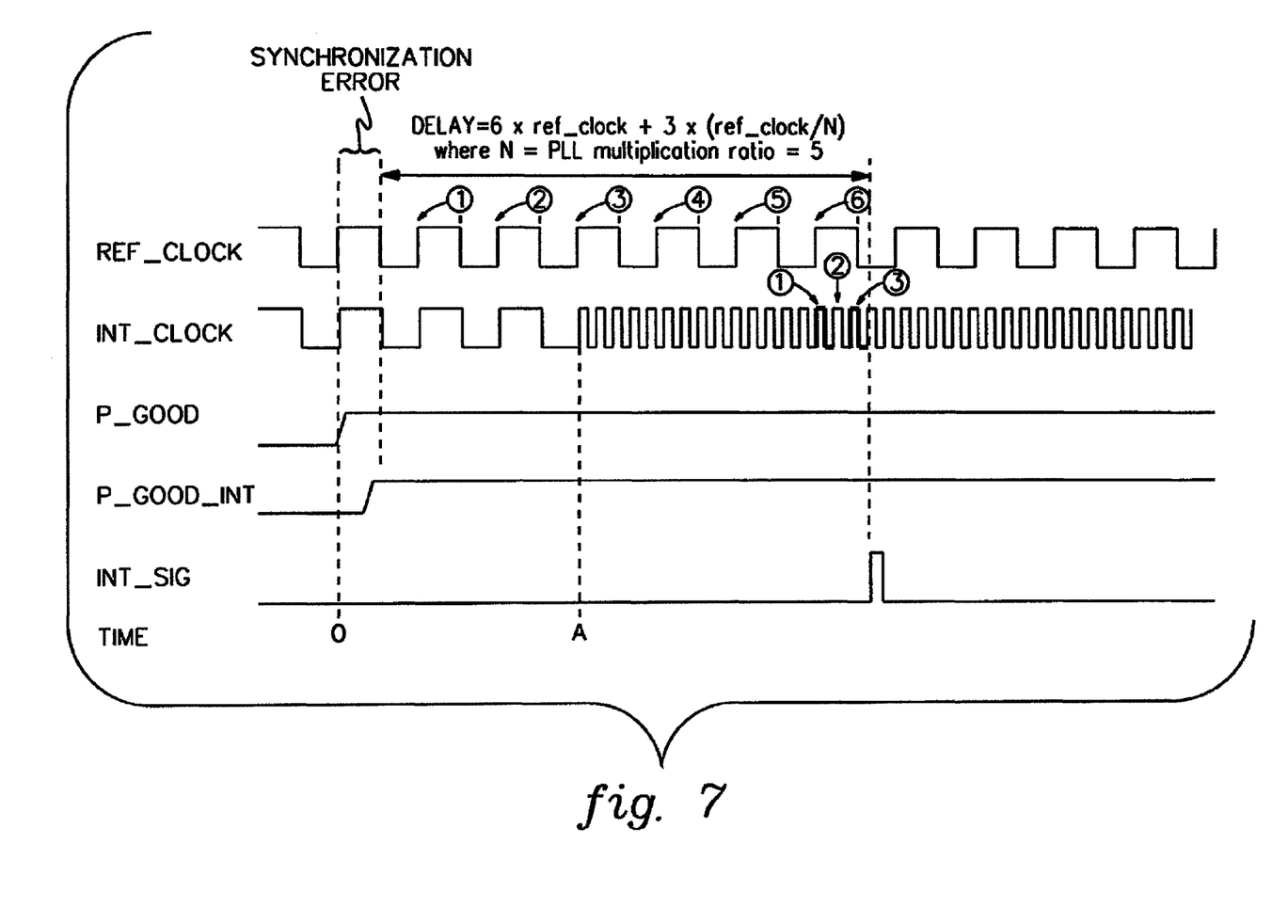
FIG. 7 is a further timing diagram showing display of various real-time external test signals and virtual internal signals correlated therewith, in accordance with an aspect of the present invention.

Any asynchronous signal or event common to both the actual component under test and the component's simulation data can be employed as a synchronizing signal or event. In an alternative implementation, a synchronizing event may be parallel bus activity (e.g., PCI), or serial bus activity (e.g., JTAG). Such external bus activity may command the component under test 130 to begin some internal sequence. This bus sequence can be used as a synchronizing event in place of the p_good synchronizing signal referred to above. Note that if the external bus is synchronous to ref_clk, then the synchronizing error identified below in FIG. 7 is eliminated.

As described further below, and depending upon the implementation, electronic test equipment 110 may also include a delay controller 300 and a delay trigger counter 310 which outputs a trigger signal 315. Delay trigger counter 310 receives as input a local clock 312 and an externally received reference clock (ref_clock), while delay controller 300 receives as input the asynchronous p_good signal to the electronic component under test, and the simulation (delay) data 140'. As noted, simulation (delay) data 140' can by synchronized on the externally applied p_good signal to the electronic component under test 130. Once synchronized or time correlated, then the imported simulation data can be used (in one embodiment described further below) to generate trigger signal 315 by providing delay data to delay controller 300 which comprises a delay from, for example, a rising p_good synchronizing event to the desired internal trigger event determined from the simulation data. Further, once correlated, virtual signals or virtual channels can be added to a common display displaying the real-time (external) test signals or channels of interest and/or can be overlaid with (i.e., compared with) the corresponding real-time accessible test signals to facilitate evaluation of the real-time test signals, and hence the electronic component. The requirements for a stable synchronization event are that the simulation data must match the electronic component under test, i.e., configuration pins and other configuration data. Further, there can be no asynchronous events occurring between the synchronizing event and the internal trigger event.

By way of example, Table 1 depicts an sample data contained within a simulation data file that is imported to the electronic test equipment. As shown, the simulation data includes a simulation clock signal, a simulation power_good signal and an internal state machine signal (labeled "sm_x"). The clock signal corresponds to the clock signal shown in FIG. 1 at one external pin of electronic component 130. Similarly, the power_good signal in the simulation data corresponds to the p_good signal at one external pin of electronic component 130 in FIG. 1.

TABLE 1

| Clock Cycle | power_good | sm_x |
|---|---|---|
| 0 | "0" | "0" |
| 1 | "1" | "1" |
| 2 | "1" | "0" |
| 3 | "1" | "0" |
| 4 | "1" | "1" |
| 5 | "1" | "1" |
| 6 | "1" | "0" |

Figure 4:
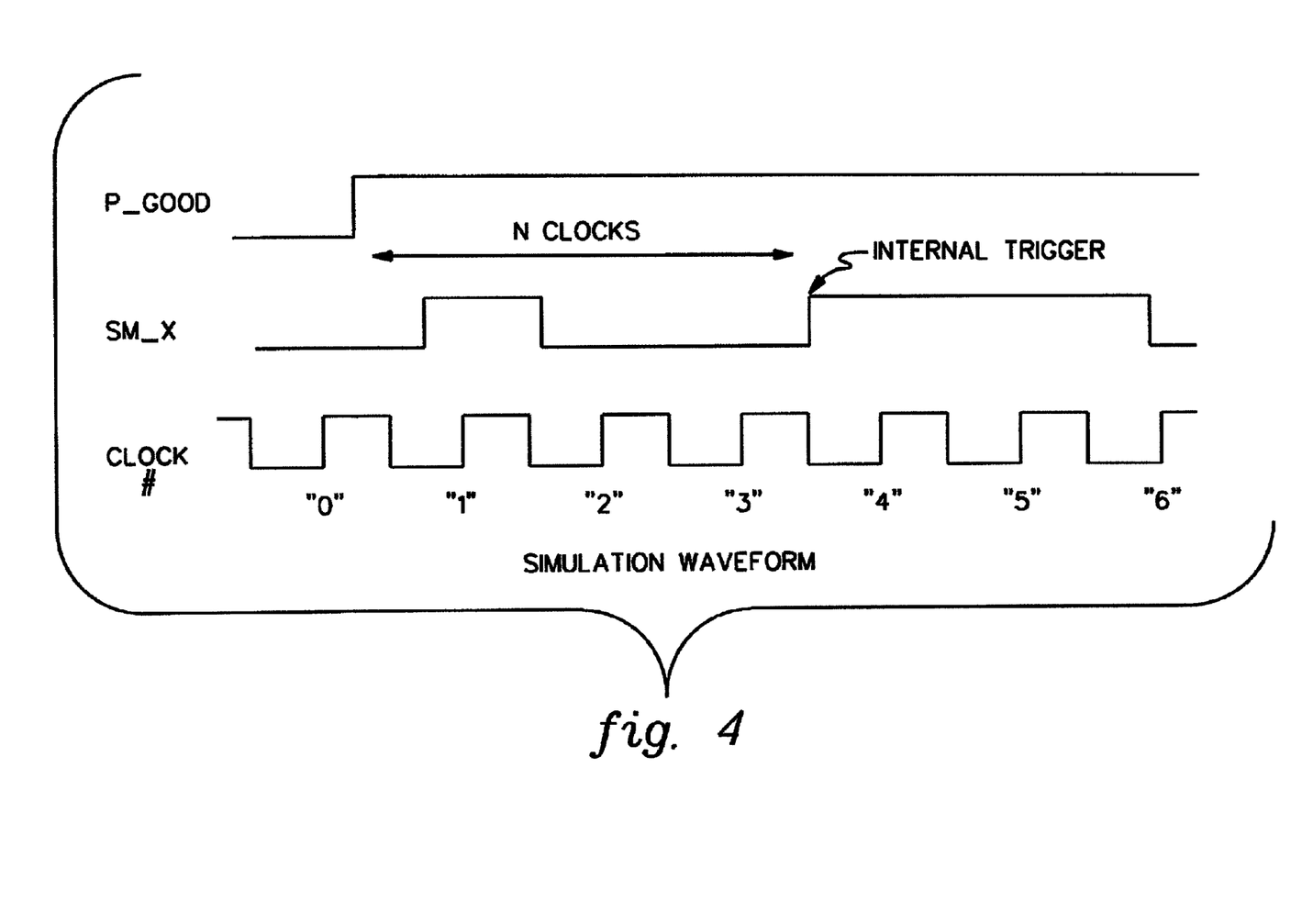
FIG. 4 is a timing diagram illustrating examples of two external test signals obtained via the electronic test equipment shown correlated and displayed with a virtual internal signal obtained from imported simulation data, in accordance with an aspect of the present invention.

FIG. 4 is a timing diagram showing one embodiment of the p_good real-time test signal and the clock reference signal at the external pins to the electronic component under test. Displayed and correlated with these signals is a virtual signal labeled "sm_x" derived from the simulation data of Table 1. This signal is an internal signal to the electronic component and is not accessible at the external pins of the component under test. The rising edge of p_good is one example of an asynchronous synchronizing event. The simulation waveform of FIG. 4 indicates n clocks occur between the synchronizing event and the second rising edge of the sm_x internal state machine signal. Again, this signal is not visible on the component under test pins, but using the n clock and other sm_x simulation waveform data is created as a virtual internal signal and displayed in a common display with the noted visible signals at the pins of the electronic component under test.

Figure 5:
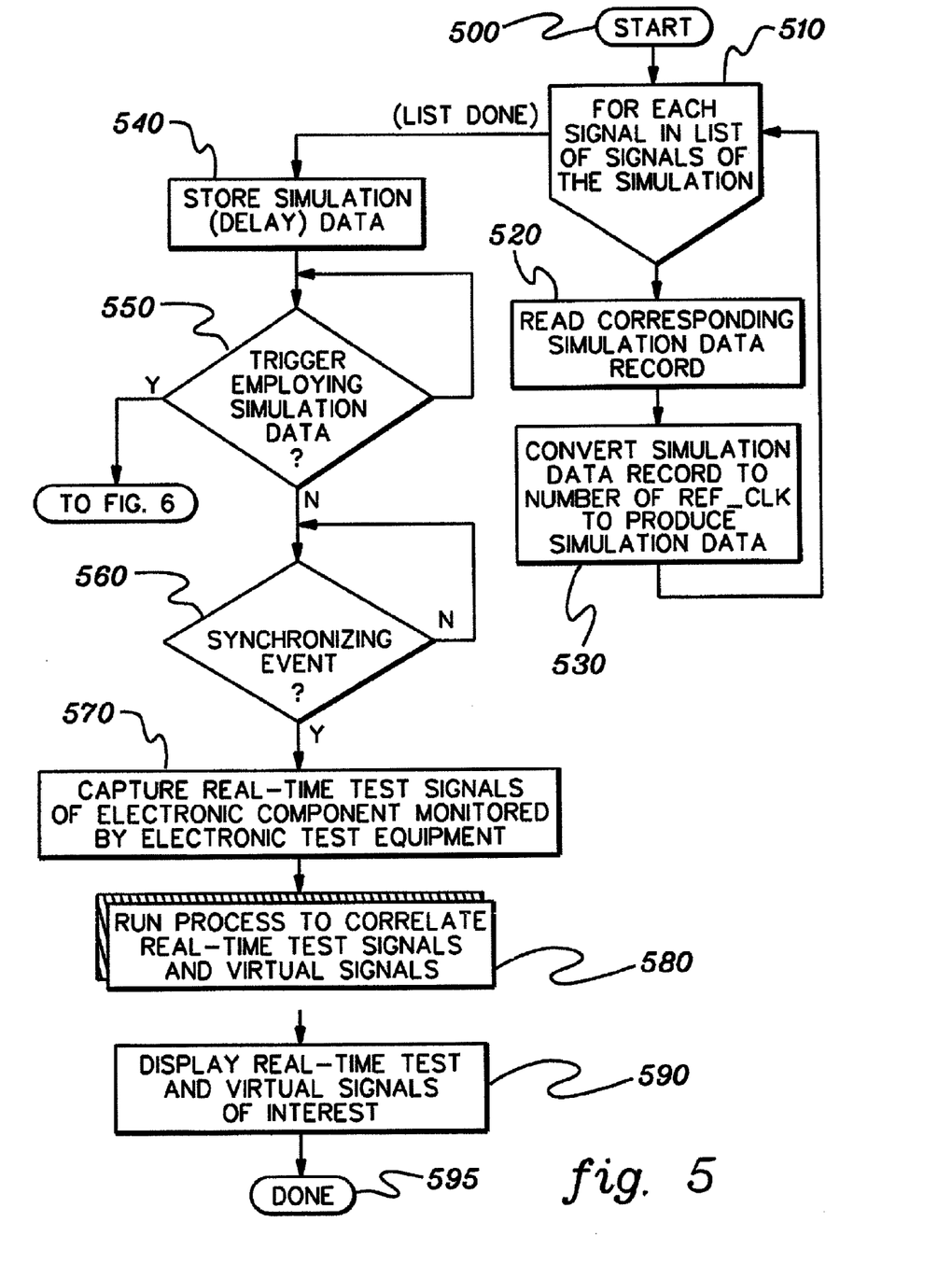
FIG. 5 is a flowchart of one embodiment of processing for displaying virtual internal signals and real-time external test signals on a common display, in accordance with an aspect of the present invention.

FIG. 5 is a flowchart of one embodiment of processing for correlating and displaying virtual signals obtained from simulation data with real-time external test signals of the component under test. Processing begins 500 with a list of desired virtual signals from the simulation results for the component 510. For each virtual signal of interest, such as the state of a state machine, the corresponding simulation record is read 520. The records are then converted to, in one embodiment, delay data representing the number of reference clocks between level changes of the virtual signals 530. This process repeats for each virtual signal of interest in the list. Once the records have been read and converted into delay data, the simulation (delay) data is stored 540 in a location accessible by the electronic test equipment, for example, in memory within the equipment. Processing then determines whether (for example) an operator has requested internal triggering of the electronic test equipment employing the simulation data 550. If so, then processing proceeds via the steps in the flowchart of FIG. 6. Otherwise, in this embodiment, it is assumed that the simulation (delay) data is to be correlated to the real-time external test signals and displayed (and/or overlaid) with the test signals for facilitating evaluation of the real-time test signals and the electronic component. Again, the virtual signals derived from the simulation data may either display an internal state of the electronic component which is non-accessible to the electronic test equipment, and is triggered by a common external trigger or external state, or may comprise accessible external signals or events which may be correlated to actual real-time test signals corresponding therewith.

Processing awaits the synchronizing event 560 (e.g., an asynchronous p_good signal rising). Again, the synchronizing event or signal sequence occurs both in the simulation data and during the real-time testing of the component under test. Once the synchronizing event has occurred, the real-time test signals of interest at the pins of the electronic component are monitored or captured by the electronic test equipment 570, and a process is run to correlate the real-time test signals with the virtual signals from the simulation data 580 using the synchronizing event as a reference. Briefly described, the process may include: setting the synchronous event as time=0 (recognizing that in virtual signals, the simulation event may occur at time=x); correlating the real time test signals with the virtual signals by subtracting x from the time of each virtual signal; and then overlaying the virtual signals over the real time test signals. Once the signals are correlated, the real-time test signals and the virtual signals of interest can be displayed 590 together or separate, which facilitates validation of the real-time test signals and the electronic component, thereby completing processing 595.

Assuming that the simulation data is to be employed to internally trigger the electronic test equipment, for example, to initiate or discontinue capturing of selected real-time test signals at the external pins of the electronic component under test, then a clock delay can initially be computed from the synchronization event to a virtual signal trigger event within the simulation data 600. As shown in the timing diagram of FIG. 7, the simulation delay data can represent integral numbers of the ref_clock cycles, and fractions of the ref_clock cycles. The test equipment has internal high-speed time base for generating a traditional delay. Therefore, fractional components of the delay is internally generated by the delay controller 300 (see FIG. 3). The delay controller can determine the trigger point based on the number of ref_clock cycles and any fraction of the ref_clock cycle resulting, for example, from a PLL clocking. The fraction of a ref_clock cycle is derived from the simulation (delay) data which gives the fractional part of the ref_clock used as the high speed internal clock source to derive a close approximation for the fractional delay.

In the example of FIG. 7:
ref_clock is the external reference clock driving a PLL clock generator.
int_clock is the internal clock.
p_good is the external power good signal to the component under test.
p_good int is the internal received p_good signal synchronized to int_clock.
int_sig is some internal signal displayed as a virtual signal.

At time A, int_clock is switched from the received ref_clk to the PLL clock generator output. The delay calculated to int_sig from time=0 is six (6) ref_clk cycles plus a fraction of a ref_clk, which is three (3) PLL clocks. If the PLL ratio is 40:1, which is a constant contained in the simulation data, the three internal clocks represent a delay of 750 pS, which again the electronic test equipment computes internally. If the synchronizing signal is asynchronous and is synchronized by the ref_clock, this adds a one ref_clock uncertainty to the final trigger point. This uncertainty may be corrected by choosing a synchronizing signal that is synchronous or canceling the synchronization error by defining a set-up/hold specification on the asynchronous input and using the specification to synchronize the event. If the asynchronous input falls within the set-up/hold specification, this can be flagged by the electronic test equipment.

Figure 6:
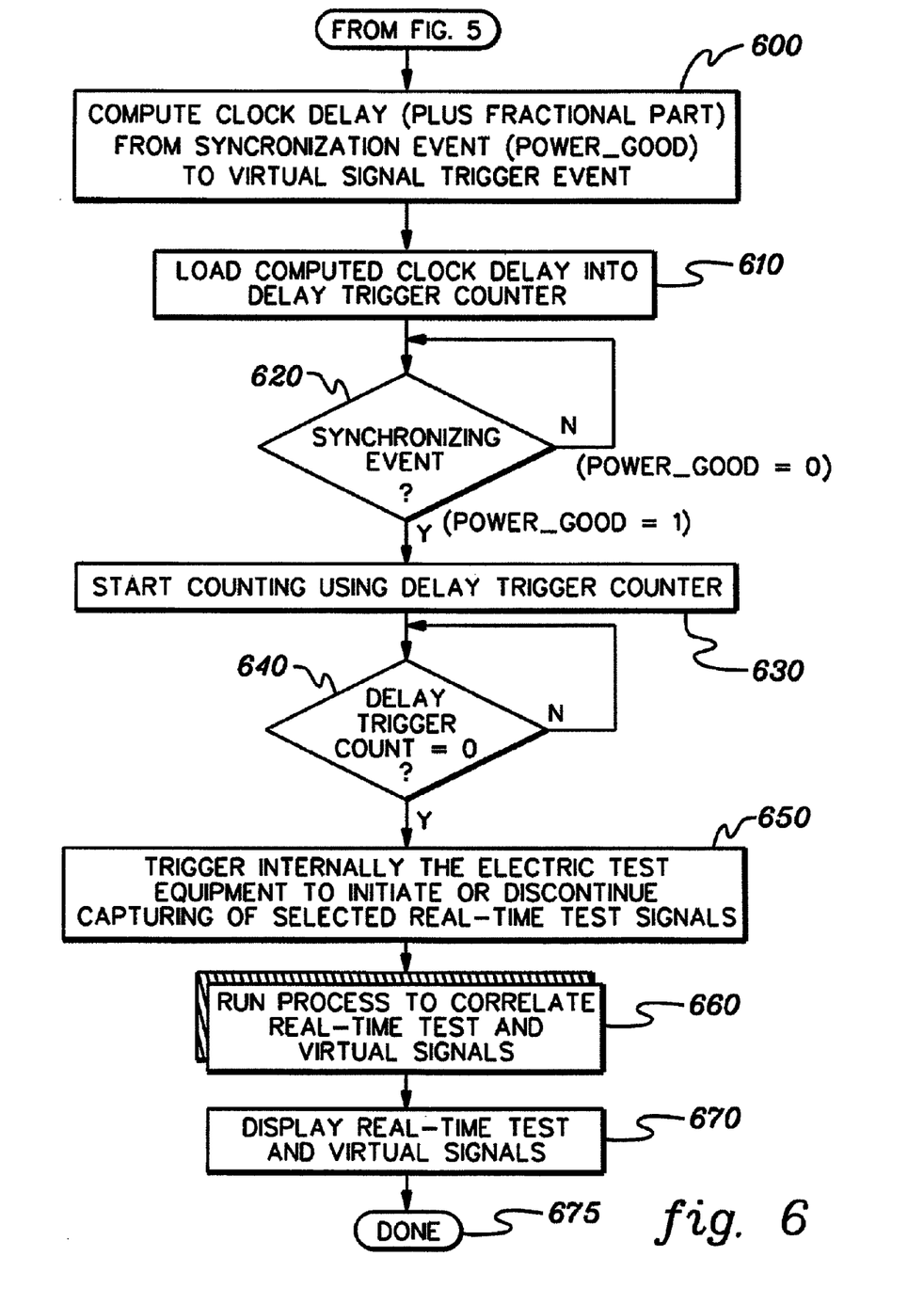
FIG. 6 is a flowchart of one embodiment of processing for internally triggering the electronic test equipment to initiate or discontinue capturing of test signals employing a trigger event automatically ascertained from simulation data imported into the electronic test equipment, in accordance with an aspect of the present invention.

Continuing with the process of FIG. 6, after computing clock delay, the delay is loaded into the delay trigger counter (see counter 310 of FIG. 3) 610, and processing awaits the synchronizing event 620. Upon occurrence of the synchronizing event, the delay trigger counter begins counting clock cycles, employing the local clock of the electronic test equipment and the ref_clock external signal at the pin of the electronic component under test. Once the delay trigger counter reaches zero (i.e., assuming that the counter is counting down), then the electronic test equipment is internally triggered to initiate or discontinue capturing of the selected real-time test signals of the component under test 650. Once the real-time test signals are captured, the real-time test signals are correlated with the virtual signals from the simulation data 660 (using the synchronizing event) and displayed 670 to facilitate evaluation of the real-time test signals and validation of the electronic component, which completes processing 675.

Those skilled in the art will note from the above discussion that the concepts presented herein could equally apply to correlation of stored simulation data with test signals imported to a computer process, which is coupled to the electronic test equipment performing the testing of the actual electronic component. This computer process could be running in a computer networked with the electronic test equipment, and the display could be associated with the computer performing the automatic correlation. The claims presented herewith are intended to encompass implementation of the above-described concepts either within the electronic test equipment or as a computer process running in a computer coupled to the electronic test equipment.

The detailed description presented above is discussed in terms of program procedures executed on a computer or network of computers. These procedural descriptions and representations are the means used by those skilled in the art to most effectively convey the substance of their work to others skilled in the art. They may be implemented in hardware or software, or a combination of the two.

A procedure is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or similar devices.

Each step of the method may be executed on any general computer, such as a mainframe computer, personal computer or the like and pursuant to one or more, or a part of one or more, program modules or objects generated from any programming language, such as C++, Java, Fortran or the like. And still further, each step, or a file or object or the like implementing each step, may be executed by special purpose hardware or a circuit module designed for that purpose.

In the case of diagrams depicted herein, they are provided by way of example. There may be variations to these diagrams or the steps (or operations) described herein without departing from the spirit of the invention. For instance, in certain cases, the steps may be performed in differing order, or steps may be added, deleted or modified. All of these variations are considered to comprise part of the present invention as recited in the appended claims.

The invention is preferably implemented in a high level procedural or object-oriented programming language to communicate with a computer. However, the invention can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of general or special purpose programmable computer according to the method of the invention and/or to structure its components in accordance with a system of the invention.

The invention may also be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another apparatus (such the electronic test equipment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computer system or other apparatus. The required structure for a variety of these systems will appear from the description given.

Again, the capabilities of one or more aspects of the present invention can be implemented in software, firmware, hardware or some combination thereof One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of testing an electronic component, the method comprising:
    storing simulation data resulting from simulation testing of an electronic component's design;
    employing electronic test equipment to perform real-time testing of the actual electronic component and obtain real-time test signals therefor;
    employing a synchronizing trigger event in automatically correlating the stored simulation data with the real-time test signals; and
    performing at least one of:
        overlaying at least a portion of the correlated simulation data as virtual signals with corresponding real-time test signals for facilitating evaluation of the real-time test signals and the electronic component, wherein the virtual signals are simulated internal signals of the electronic component which are inaccessible to external testing thereof, including using the electronic test equipment; or
        displaying at least a portion of the correlated simulation data as virtual signals with the real-time test signals on a common display for facilitating evaluation of the real-time test signals and the electronic component, wherein the virtual signals are simulated internal signals of the electronic component which are inaccessible to external testing thereof, including using the electronic test equipment.

2. The method of claim 1, wherein the storing comprises importing the simulation data into storage accessible electronically by the electronic test equipment, and wherein the correlating and the performing are automatically performed by the electronic test equipment.

3. The method of claim 2, wherein the electronic test equipment comprises one of an oscilloscope and a logic analyzer.

4. The method of claim 2, further comprising formatting the simulation data for import into the electronic test equipment, the formatting comprising automatically extracting selected records of the simulation data corresponding to an electronic component signal of interest.

5. The method of claim 1, further comprising employing an external signal of the electronic component as the synchronizing trigger event to initiate capturing of the real-time test signals by the electronic test equipment, the external signal being at least one signal at an external port of the electronic component during the real-time testing thereof and at least one signal represented by the stored simulation data, and wherein the synchronizing trigger event is employed during the correlating.

6. The method of claim 1, wherein the performing further comprises triggering the electronic test equipment automatically employing the trigger event ascertained from the stored simulation data, and wherein the method further comprises automatically ascertaining the trigger event, the automatically ascertaining comprising:
computing a clock delay value from a data synchronizing event to a simulation data trigger event;
loading the computed clock delay value into a delay trigger counter employed by the electronic test equipment;
waiting for the synchronizing event to occur;
upon occurrence of the synchronizing event, starting counting of the delay trigger counter, and upon reaching the loaded clock delay value, triggering the electronic test equipment to either initiate capturing or discontinue capturing of at least one real-time test signal at an accessible port of the electronic component under test.

7. The method of claim 6, wherein the performing further comprises displaying on a common display at least a portion of the correlated simulation data as at least one virtual signal, along with the captured at least one real-time test signal.

8. A system for testing an electronic component, the system comprising:
an electronic test equipment for performing real-time testing of an actual electronic component and obtaining real-time test signals therefor;
means for storing simulation data, resulting from simulation testing of the electronic component's design, in a format and location accessible electronically by the electronic test equipment;
means for employing a synchronizing trigger event in automatically correlating the stored simulation data with the real-time test signals; and
means for performing at least one of:
overlaying at least a portion of the correlated simulation data as virtual signals with corresponding real-time test signals for facilitating evaluation of the real-time test signals and the electronic component, wherein the virtual signals are simulated internal signals of the electronic component which are inaccessible to external testing thereof, including using the electronic test equipment; or
displaying at least a portion of the correlated simulation data and the real-time test signals on a common display for facilitating evaluation of the real-time test signals and the electronic component, wherein the virtual signals are simulated internal signals of the electronic component which are inaccessible to external testing thereof, including using the electronic test equipment.

9. The system of claim 8, wherein the means for storing comprises means for importing the simulation data into storage accessible electronically by the electronic test equipment, and wherein the means for correlating and the performing are automatically performed within the electronic test equipment.

10. The system of claim 9, wherein the electronic test equipment comprises one of an oscilloscope and a logic analyzer.

11. The system of claim 9, further comprising means for formatting the simulation data for import into the electronic test equipment, the means for formatting comprising means for automatically extracting selected records of the simulation data corresponding to an electronic component signal of interest.

12. The system of claim 8, further comprising means for employing an external signal of the electronic component as the synchronizing trigger event to initiate capturing of the real-time test signals by the electronic test equipment, the external signal being at least one signal at an external port of the electronic component during the real-time testing thereof and at least one signal represented by the stored simulation data, and wherein the synchronizing trigger event is employed during the correlating.

13. The system of claim 8, wherein the means for performing further comprises means for triggering the electronic test equipment automatically employing the trigger event ascertained from the stored simulation data, and wherein the system further comprises means for automatically ascertaining the trigger event, the means for automatically ascertaining comprising:
means for computing a clock delay value from a data synchronizing event to a simulation data trigger event;
means for loading the computed clock delay value into a delay trigger counter employed by the electronic test equipment;
means for waiting for the synchronizing event to occur;
upon occurrence of the synchronizing event, means for starting counting of the delay trigger counter, and upon reaching the loaded clock delay value, for triggering the electronic test equipment to either initiate capturing or discontinue capturing of at least one real-time test signal at an accessible port of the electronic component under test.

14. The system of claim 13, wherein the means for performing further comprises means for displaying on a common display at least a portion of the correlated simulation data as at least one virtual signal, along with the captured at least one real-time test signal.

15. A program storage device readable by a computer, tangibly embodying at least one program of instructions executable by the computer to perform testing of an electronic component when executing on the computer, comprising:
storing simulation data resulting from simulation testing of an electronic component's design;
employing electronic test equipment to perform real-time testing of the actual electronic component and obtain real-time test signals therefor;
employing a synchronizing trigger event in automatically correlating the stored simulation data with the real-time test signals; and
performing at least one of:
overlaying at least a portion of the correlated simulation data as virtual signals with corresponding real-time test signals for facilitating evaluation of the real-time test signals and the electronic component, wherein the virtual signals are simulated internal signals of the electronic component which are inaccessible to external testing thereof, including using the electronic test equipment; or displaying at least a portion of the correlated simulation data as virtual signals with the real-time test signals on a common display for facilitating evaluation of the real-time test signals and the electronic component, wherein the virtual signals are simulated internal signals of the electronic component which are inaccessible to external testing thereof, including using the electronic test equipment.

16. The program storage device of claim 15, wherein the storing comprises importing the simulation data into storage accessible electronically by the electronic test equipment, and wherein the correlating and the performing are automatically performed by the electronic test equipment.

17. The program storage device of claim 15, further comprising employing an external signal of the electronic component as the synchronizing trigger event to initiate capturing of the real-time test signals by the electronic test equipment, the external signal being at least one signal at an external port of the electronic component during the real-time testing thereof and at least one signal represented by the stored simulation data, and wherein the synchronizing trigger event is employed during the correlating.

* * * * *